United States Patent

Tong et al.

(10) Patent No.: US 8,722,485 B1
(45) Date of Patent: May 13, 2014

(54) INTEGRATED CIRCUITS HAVING REPLACEMENT GATE STRUCTURES AND METHODS FOR FABRICATING THE SAME

(71) Applicant: GLOBALFOUNDRIES, Inc., Grand Cayman (KY)

(72) Inventors: Wei Hua Tong, Grand Cayman (KY); Yiqun Liu, Grand Cayman (KY); Tae-Hoon Kim, Grand Cayman (KY); Seung Kim, Grand Cayman (KY); Haiting Wang, Clifton Park, NY (US); Huang Liu, Mechanicville, NY (US)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/851,810

(22) Filed: Mar. 27, 2013

(51) Int. Cl.
   *H01L 21/8238* (2006.01)

(52) U.S. Cl.
   USPC .............. 438/216; 438/591; 257/E21.625

(58) Field of Classification Search
   CPC ........... H01L 21/2252; H01L 21/0234; H01L 21/0232; H01L 29/517; H01L 21/823842; H01L 21/823857
   USPC ............ 438/199, 216, 287, 585, 591, 785; 257/E21.625
   See application file for complete search history.

(56) References Cited

U.S. PATENT DOCUMENTS

2010/0041222 A1 *  2/2010  Puchner et al. ............... 438/591

OTHER PUBLICATIONS

M. P. Seah and S. J. Spencer; Ultrathin SiO2 on Si II. Issues in quantification of the oxide thickness; Surface and Interface Analysis Surf. Interface Anal. 2002; 33: 640-652.

* cited by examiner

*Primary Examiner* — Thanhha Pham
(74) *Attorney, Agent, or Firm* — Ingrassia Fisher & Lorenz, P.C.

(57) ABSTRACT

A method of fabricating an integrated circuit includes the steps of providing a semiconductor substrate having formed thereon a sacrificial silicon oxide layer, an interlayer dielectric layer formed over the sacrificial silicon oxide layer, and a dummy gate structure formed over the sacrificial silicon oxide layer and within the interlayer dielectric layer, removing the dummy gate structure to form an opening within the interlayer dielectric layer, and removing the sacrificial silicon oxide layer within the opening to expose the semiconductor substrate within the opening. The method further includes the steps of thermally forming an oxide layer on the exposed semiconductor substrate within the opening, subjecting the thermally formed oxide layer to a decoupled plasma oxidation treatment, and etching the thermally formed oxide layer using a self-saturated wet etch chemistry. Still further, the method includes depositing a high-k dielectric over the thermally formed oxide layer within the opening.

22 Claims, 4 Drawing Sheets

INTEGRATED CIRCUITS HAVING REPLACEMENT GATE STRUCTURES AND METHODS FOR FABRICATING THE SAME

TECHNICAL FIELD

Embodiments of the subject matter described herein relate generally to integrated circuits and methods for fabricating integrated circuits. More particularly, the subject matter relates to integrated circuits and methods for fabricating integrated circuits having replacement gate structures.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of lightly-doped drain structures, multiple implants for source/drain regions, silicidation of gates and source/drains, and multiple sidewall spacers, for example.

The drive for high performance requires high-speed operation of microelectronic components requiring high drive currents in addition to low leakage, i.e., low off-state current, to reduce power consumption. Typically, the structural and doping parameters tending to provide a desired increase in drive current of the transistor adversely impact leakage current.

Metal gate electrodes have evolved for improving the drive current by reducing polysilicon depletion. However, simply replacing polysilicon gate electrodes with metal gate electrodes may engender issues in forming the metal gate electrode prior to high-temperature annealing to activate the source/drain implants, such as at temperatures in excess of 900° C. Such fabrication techniques may degrade the metal gate electrode or cause interaction with the gate dielectric layer, thereby adversely impacting transistor performance.

Replacement gate techniques have been developed to address problems attendant upon substituting metal gate electrodes for polysilicon gate electrodes. For example, a polysilicon gate is used during initial processing until high temperature annealing to activate source/drain implants has been implemented. Subsequently, the polysilicon is removed and replaced with a metal gate.

An initial step in fabricating this "replacement metal gate" is the formation of an interfacial oxide layer to serve as a barrier between the silicon substrate and the replacement metal gate, particularly the high-k dielectric (for example, a hafnium oxide liner) of the replacement metal gate. In the prior art, the interfacial oxide layer is formed by, for example, a chemical oxide treatment such as ozone. As shown in FIG. 1, the interfacial chemical oxide ("ChemOx" layer) is formed over the silicon substrate ("Si"). Thereafter, the high-k dielectric ("HfOx") is deposited, followed by formation of the metal gate ("MG"). However, the resulting interfacial chemical oxide layer is porous and as such is prone to high-k metal incorporation upon the subsequent deposition of the high-k dielectric, thus leading to a diffused junction with the high-k dielectric, as shown in FIG. 1. It is well-known that non-terminated sites in a diffused junction contribute to negative/positive bias temperature instability (NBTI/PBTI) degradation, as further shown in FIG. 1, which causes a loss in device performance. Further, the thickness of the chemical oxide is difficult to control, which leads to the variation of the device performance and reliability problems. It is also difficult to further scale-down device sizes using techniques such as chemical oxidation that are subject to variability.

Accordingly, it is desirable to provide methods for the fabrication of integrated circuits with replacement metal gate structures that provide an improved interfacial oxide layer between the silicon substrate and the replacement metal gate electrode. Particularly, it is desirable to provide methods for the fabrication of nitrated circuits wherein the interfacial oxide layer is not susceptible to high-k dielectric diffusion or temperature stability degradation. Furthermore, other desirable features and characteristics of the present invention will become apparent from the subsequent detailed description of the invention and the appended claims, taken in conjunction with the accompanying drawings, the brief summary, and this background of the invention.

BRIEF SUMMARY

Methods of manufacturing integrated circuits having replacement metal gate structures, and the integrated circuits formed thereby, are disclosed herein. In accordance with an exemplary embodiment, a method of fabricating an integrated circuit includes the steps of providing a semiconductor substrate having formed thereon a sacrificial silicon oxide layer, an interlayer dielectric layer formed over the sacrificial silicon oxide layer, and a dummy gate structure formed over the sacrificial silicon oxide layer and within the interlayer dielectric layer, removing the dummy gate structure to form an opening within the interlayer dielectric layer, and removing the sacrificial silicon oxide layer within the opening to expose the semiconductor substrate within the opening. The method further includes the steps of thermally forming an oxide layer on the exposed semiconductor substrate within the opening, subjecting the thermally formed oxide layer to a decoupled plasma oxidation treatment, and etching the thermally formed oxide layer using a self-saturated wet etch chemistry. Still further, the method includes depositing a high-k dielectric over the thermally formed oxide layer within the opening.

This brief summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

For the sake of brevity, conventional techniques related to semiconductor device fabrication are not described in detail herein. Moreover, the various tasks and process steps described herein may be incorporated into a more comprehensive procedure or process having additional steps or functionality not described in detail herein. In particular, various steps in the manufacture of semiconductor-based integrated circuits are well known and so, in the interest of brevity, many conventional steps are only mentioned briefly herein or will be omitted entirely without providing the well-known process details.

The techniques and technologies described herein are utilized to fabricate MOS integrated circuit devices, including nMOS integrated circuit devices, pMOS integrated circuit devices, and cMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
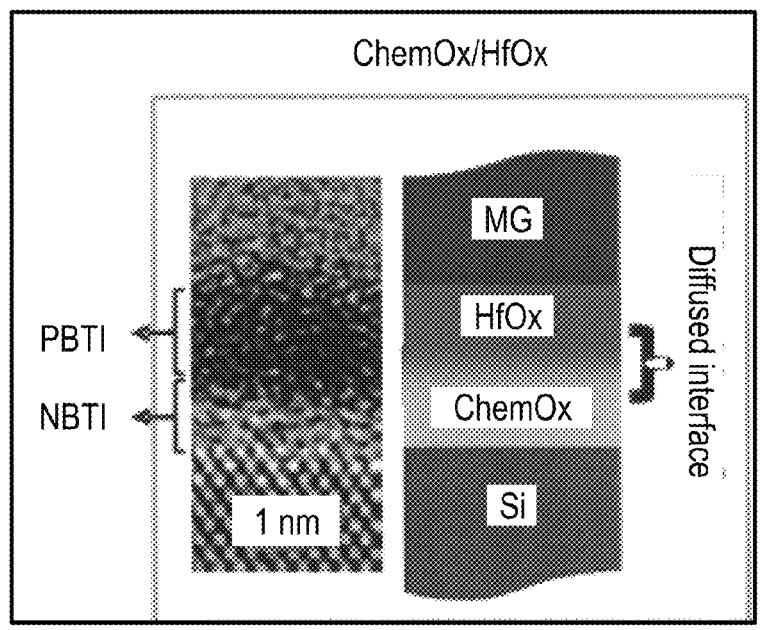
FIG. 1 is an illustration of the interfacial chemical oxide layer of a replacement metal gate structure known in the prior art.
Figure 2:
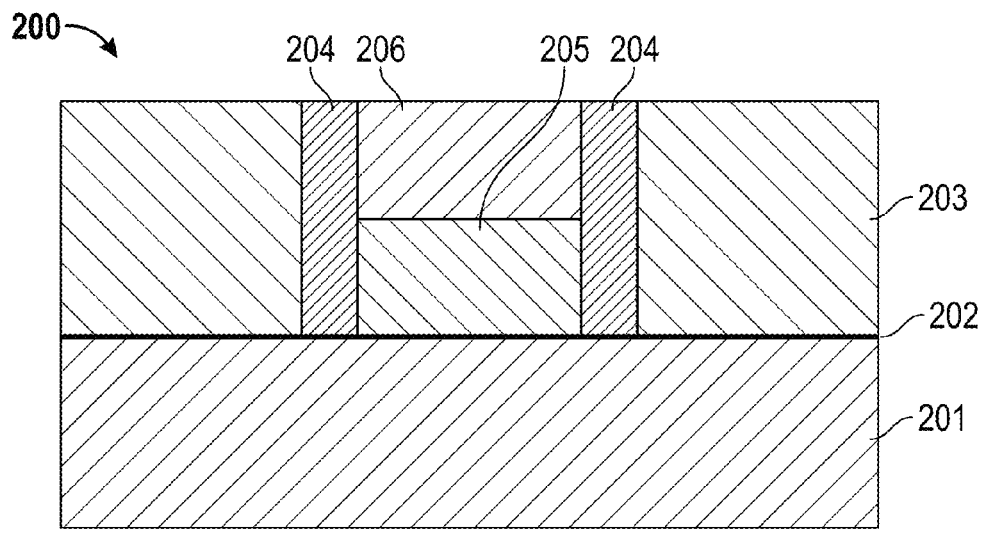
FIGS. 2-6 are partial cross-sectional views of a partially-formed integrated circuit illustrating certain aspects of a method for fabricating an integrated circuit having a replacement gate structure in accordance with various embodiments of the present disclosure.

An exemplary method for fabricating a MOS integrated circuit in accordance with one embodiment of the present disclosure is set forth in FIGS. 2-6. With reference to FIG. 2, in one embodiment, depicted is a cross-sectional view of a partially-formed integrated circuit (IC) prior to forming the replacement gate structure thereon. The partially-formed IC includes a semiconductor substrate 201. As used herein, the term "semiconductor substrate" is used to encompass semiconductor materials conventionally used in the semiconductor industry from which to make electrical devices. "Semiconductor materials" include monocrystalline silicon materials, such as the relatively pure or impurity-doped monocrystalline silicon materials typically used in the semiconductor industry, as well as polycrystalline silicon materials, and silicon admixed with other elements such as germanium, carbon, and the like. In addition, "semiconductor materials" encompass other materials such as relatively pure and impurity-doped germanium, gallium arsenide and other III-V compounds, zinc oxide, glass, and the like. Also, the substrate 201 can be a planar substrate such as bulk Si, SOI or a 3D substrate that includes FINs or nanowires.

Figure 3:
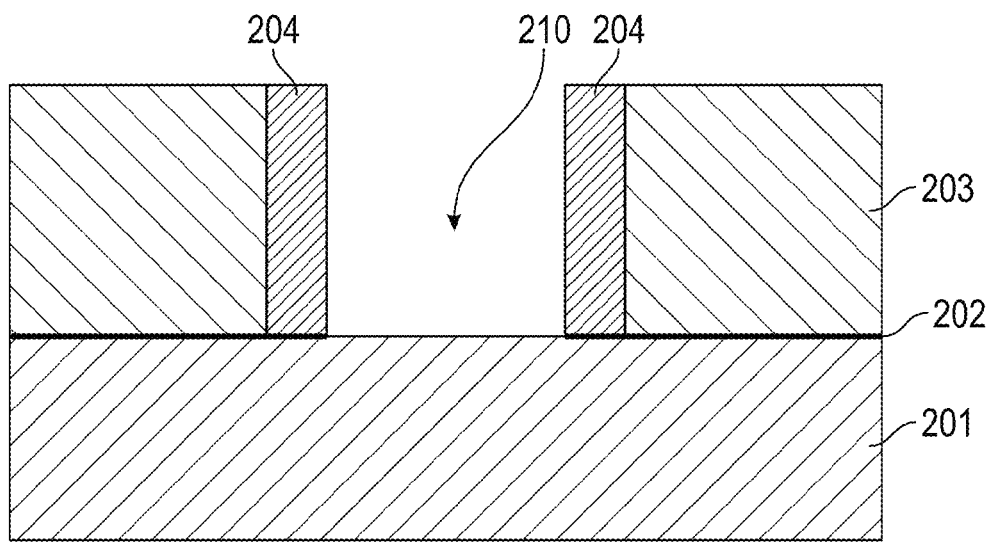

The semiconductor substrate 201 shown in FIG. 2 includes a thin (i.e., less than 5 nm thick) insulating silicon oxide layer 202 disposed over the surface of the semiconductor substrate 201. The silicon oxide layer 202 is provided as a sacrificial or "dummy" layer to facilitate the deposition of subsequent intermediate layers in the formation of the replacement metal gate structure thereon, and which is eventually removed (in part, as shown in FIG. 3) prior to the formation of the replacement gate materials, as will be discussed in greater detail below. An inter-layer dielectric (ILD) layer 203 is formed overlying the substrate 201 and the dummy silicon oxide layer 202. ILD layer 203 may include a deposited silicon oxide, silicon nitride, or silicon oxynitride, or another material suitable for providing electrical isolation between semiconductive transistor structures. ILD layer 203 may be blanket-deposited using, for example, a PECVD, a low pressure chemical vapor deposition (LPCVD), or a CVD process. In one embodiment, ILD layer 203 includes a silicon oxide material and has a thickness (between oxide layer 202 and the top of ILD layer 203) of about 50 nm to about 1 micron, for example a thickness of about 100 nm to about 500 nm.

Above the semiconductor substrate 201 and the silicon oxide layer 202 is provided a "dummy gate" stack 200. The dummy gate stack 200 includes a "dummy" polycrystalline silicon gate structure 205 that is capped by a hardmask 206. The hardmask 206 is formed of, for example, various types of materials including, silicon oxynitride, amorphous silicon, silicon oxide, silicon nitride, and the like. In one embodiment, the dummy gate structure 205 is about 10 nm to about 70 nm thick, and the hardmask 206 is about 10 nm to about 200 nm thick. The dummy gate stack 200 further includes sidewall spacers 204, which are present on either side of the dummy gate structure 205 and the hardmask 206. The sidewall spacers 204 are formed from a spacer-forming layer, which itself is formed via the blanket deposition of silicon nitride, silicon oxide, or another suitable dielectric material. The spacer-forming layer is next subjected to a series of etching steps to form sidewall spacers 204. For example, an anisotropic or directional etch is performed to remove selected portions of the spacer-forming layer to thereby create sidewall spacers 204 adjacent opposing sides of the dummy gate structure 205 and the hardmask 206. The space between the formed sidewall spacers 204, and thus the width of the dummy gate structure 205 and the hardmask 206, in an embodiment, is between about 10 nm and about 30 nm.

As such, FIG. 2 depicts the partially-formed integrated circuit at a stage in the replacement gate forming process, prior to the deposition of any high-k, barrier, or replacement gate fill material, that is conventional and well-known in the so-called "gate last" technological arts related to integrated circuits. As such, greater details regarding the patterning and formation of the silicon oxide layer 202, the dummy gate stack 200, and the formation of the sidewall spacers 204 need not be provided.

With reference now to FIG. 3, the exemplary method continues with a step of removing the dummy gate stack 200 and the portion of the oxide layer 202 underneath the dummy gate stack 200 to form an opening 210 within the ILD layer 203. The hard-mask 206 and the dummy gate 205 are etched using a suitable etch chemistry, as is known in the art, thus forming the opening 210 within ILD layer 203 (alternatively, two or more separate etch steps may be employed). For example, a suitable etching technique includes the application of hot phosphoric acid ($H_3PO_4$), or a selective plasma dry etch, especially for nitride etching. Regarding the removal of the silicon oxide layer 202, the silicon oxide can be removed in a solution of hydrofluoric (HF) acid. HF acid is used to etch silicon oxide ($SiO_2$) films on silicon (Si) substrates, because the HF acid will etch the $SiO_2$ without attacking the Si surface. The HF acid it typically diluted with deionized (DI) water in order to slow down the etch rate of the $SiO_2$, thereby ensuring better etch uniformity. In one embodiment, the dilution ratio ranges from 1:1 HF:$H_2O$ to 300:1 $H_2O$:HF. In another embodiment, the HF acid may be diluted with ammonium fluoride ($NH_4F$). In further embodiments, the silicon can be removed using TMAH, ammonium hydroxide, or potassium hydroxide. The removal of the silicon oxide layer 202 in the opening 210 results in a structure substantially as shown in FIG. 3, with the silicon substrate 201 exposed in the region of the opening 210.

Figure 4:
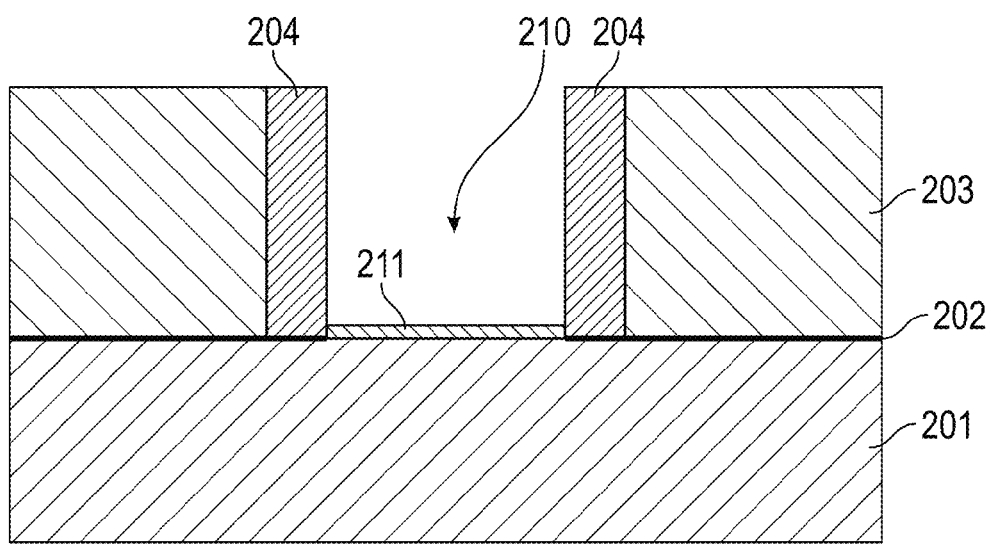
Figure 5:
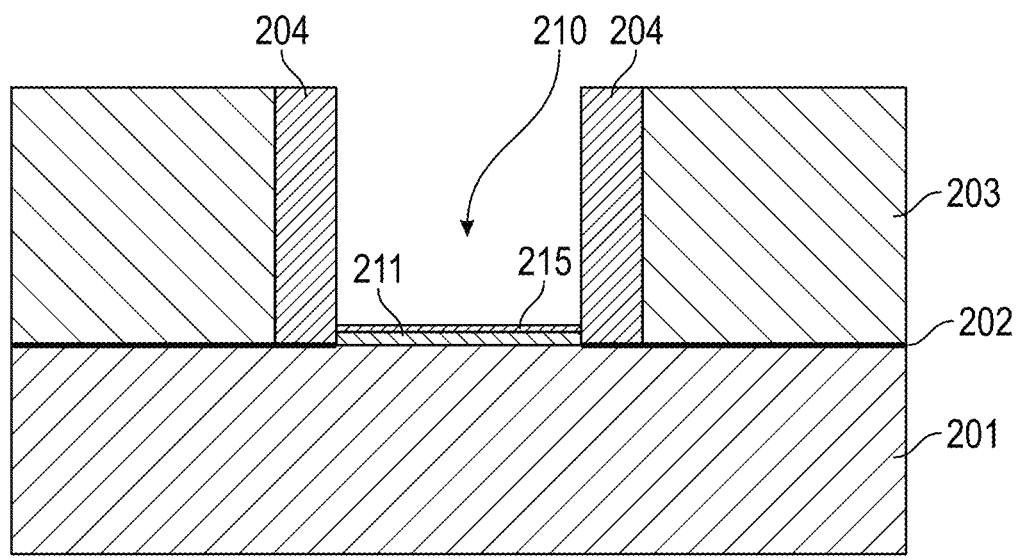

Thereafter, with reference now to FIG. 4, the method continues with the formation of a thermal oxide layer 211 over the silicon substrate 201 in the region of the opening 210. For example, thermal oxidation is typically performed in a furnace or a rapid thermal processor at an elevated temperature (for example from about 700° C. to about 1100° C.) in the presence of an oxide forming material, such as an oxidizing ambient. Thermal oxidation can be classified into wet and dry thermal oxidation depending on the oxidizing ambient. During thermal oxidation, a silicon substrate is consumed (0.44 nm with respect to every 1 nm of growing thermal oxide layer) and a volume expansion occurs (2.2 times the consumed silicon). This thermal silicon oxide layer 211 should be from about 4 Å to about 15 Å in thickness, for example about 5 Å in thickness or about 12-14 Å in thickness. In a particularly preferred embodiment, low pressure in situ stream generation (LP-ISSG) oxidation is employed to form the layer 211.

Subsequent to the formation of the thermal oxide layer 211, the thermal oxide layer 211 is subjected to a decoupled plasma oxidation (DPO) treatment in order to improve the interfacial qualities of the layer 211. DPO may be carried out in suitably equipped plasma reactors, such as Decoupled Plasma Oxidation (DPO) reactors available from Applied Materials, Inc., of Santa Clara, Calif., or elsewhere. The DPO reactor may provide a low ion energy plasma via an inductively coupled plasma source power applicator driven by a pulsed or continuous wave (CW) RF power generator. The reactor includes a chamber having a cylindrical side wall and a ceiling, which may be either dome-shaped (as shown in the drawing), flat, or other geometry. The plasma source power applicator comprises a coil antenna disposed over the ceiling and coupled through an impedance match network to an RF power source consisting of an RF power generator and a gate at the output of the generator controlled by a pulse signal having a selected duty cycle. The RF power generator is configured to provide power between about 50 watts to about 2500 watts. It is contemplated that other low ion energy producing plasma source power applicators may be utilized as well, such as remote RF or microwave plasma sources.

Figure 7:
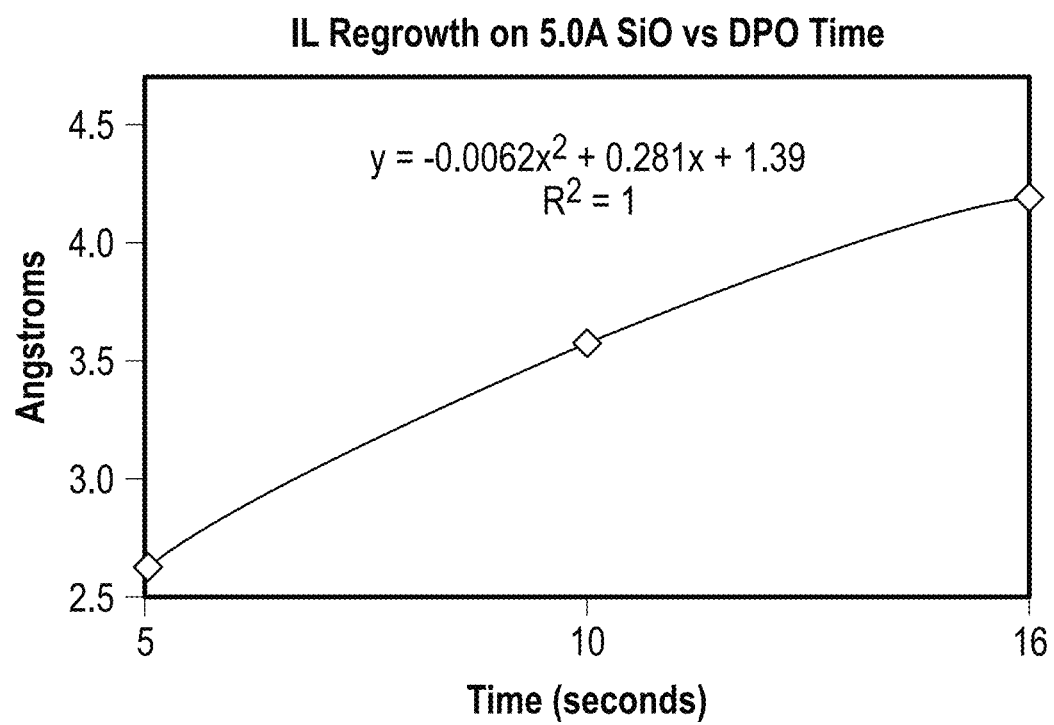
FIG. 7 illustrates the growth of a silicon oxide layer on an integrated circuit using decoupled plasma oxidation techniques.

The application of the DPO treatment improves the quality of the silicon oxide layer 211 by reducing the porosity of the layer 211, thereby rendering it less susceptible to high-k metal diffusion therein. As such, the application of the DPO treatment results in a higher-quality oxide layer 211. Further, as shown in FIG. 7, the growth the oxide layer 211 (i.e., an increase in thickness of the layer 211 due to the application of the DPO treatment) is highly controllable, and as such leads to greater uniformity in the layer 211. In an embodiment, DPO is performed so as to increase the thickness of the thermally formed oxide layer by at least about 1 Angstrom.

Subsequent to the application of the DPO treatment, the layer 211 is subjected to a self-saturated wet etch procedure to thin the silicon oxide layer 211. In one example, the self-saturated wet etch includes a "SC1" etching chemistry. As is known in the art, an SC1 etching chemistry is composed of a mixture of ammonium hydroxide, hydrogen peroxide, and water ($NH_4OH:H_2O_2:H_2O$). The ratios of the components in the mixture can be adjusted, depending on desired properties of the etch, as is well-known in the art. In an embodiment, the SC1 etch is performed so as to remove about 1 Å of thickness of the silicon oxide layer 211. Further, the wet etch modifies the oxide layer 211 surface to be high-k material compatible. For example, as demonstrated in Table 1, below, subjecting the interfacial layer ("IL") oxide 211 to the wet etch procedures brings the interfacial charge ($D_{it}$) of oxide layer 211 into close parity with the interfacial charge of interfacial layers produced using prior art techniques, such as chemical $O_3$ oxidation, as noted above. In contrast, as also shown in Table 1, the interfacial oxide layer 211, without the wet etch procedure application thereto, suffers from nearly a 10-fold reduction in interfacial charge performance (i.e., $D_{it}$ increases from $1.80 \times 10^{12}$ to $1.50 \times 10^{13}$ $cm^{-2}/eV$).

| IL | Dit |
|---|---|
| O3 IL | 1.90E+12 |
| thermal oxide w/o wet etch | 1.50E+13 |
| thermal oxide w wet etch | 1.80E+12 |

In alternative embodiments, the above-noted SC1 etch can be replaced with the application of de-ionized water (DIW) and ozone ($O_3$). Using this treatment, the thickness of the layer 211 is not significantly affected, but the layer is made to be more compatible with high-k materials, as noted above. In a further alternative embodiment, etching can be performed using dilute hydrogen fluoride (DHF), where this etching removes from about 2 Å to about 6 Å in thickness, as well as making the layer 211 more high-k compatible. For example, about 150:1 DHF applied for about 20 seconds can remove about 6 Å thermal oxide, whereas about 300:1 DHF applied for about 7 seconds can remove about 2 Å thermal oxide. The choice of treatment of the layer 211 to be more compatible with the high-k material can thus depend on the desire final thickness of the layer 211, according to design considerations.

The method continues with a step forming the replacement gate structure. With accompanying reference now to FIG. 5, a high-k material layer 215 is first deposited as a barrier layer to prevent electrical leakage from the replacement metal gate to be deposited. The high-k material layer 215 can include a hafnium (Hf) or zirconium (Zr) oxide, or any other metal oxide with a sufficiently high dielectric constant as are well-known in the art. In an exemplary embodiment, the high-k material for layer 215 is $HfO_2$. The high-k material layer 215 can be deposited by any technique known in the art that provides for conformal deposition thereof in the first opening 210 and in the first extended portion 251. In one embodiment, the high-k material layer 215 is deposited using atomic layer deposition (ALD). With the above-described process for forming the interfacial oxide layer 211, the subsequent deposition of the high-k material 215 can be performed without the negative effects encountered in the prior art, such as the diffusion of the high-k metal layer 215 into the interfacial oxide layer 211.

Figure 6:
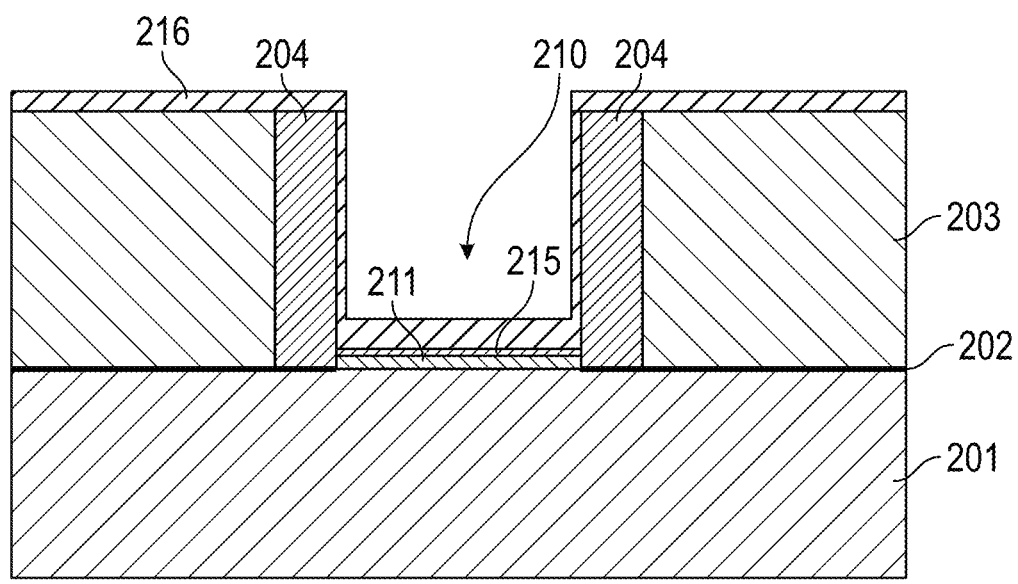

As further shown in FIG. 6, one or more workfunction material layers are thereafter deposited, patterned, and etched over the high-k layer 215. In the particular embodiment, shown in FIG. 6, a layer 216 of a workfunction material is deposited over the high-k layer 215. A portion of the opening 210 remains open. Various workfunction materials, provided in various layers, are known in the art, and the present disclosure is not intended to be limited to any workfunction material or any number of layers of workfunction materials. Further, with regard to any embodiment, it will be appreciated that the workfunction metal layer 216 should be provided at a sufficient thickness so as to set the correct threshold voltage ($V_t$).

Thereafter, a low-resistance metal gate material fill layer, such as tungsten or aluminum, can be deposited to fill the opening 210 (not shown), thus completing the replacement metal gate structure.

Although not illustrated, the partially-formed integrated circuit shown in FIG. 6 is completed in a conventional manner by, for example, providing electrical contacts to the source and drain regions and to the gate electrodes. This conventional processing may include, for example, depositing interlayer dielectrics, etching contact vias, filling the contact vias with conductive plugs, and the like as are well known to those of skill in the art of fabricating semiconductor circuits. Additional post-processing may include the formation of one or more metal layers (M1, M2, etc.) and interlayer dielectric layers therebetween to complete the various electrical connections in the integrated circuit. The present disclosure is not intended to exclude such further processing steps as are necessary to complete the fabrication of the functional integrated circuit.

As such, the subject matter disclosed herein, in one embodiment, includes an integrated circuit fabrication technique for forming a replacement gate structure that has numerous advantages over techniques conventionally employed in the art. For example, the illustrated process flow provides methods for the fabrication of integrated circuits with replacement metal gate structures that provide an improved interfacial oxide layer between the silicon substrate and the replacement metal gate electrode. Further, the illustrated process flow provides methods for the fabrication of nitrated circuits wherein the interfacial oxide layer is not susceptible to high-k dielectric diffusion or temperature stability degradation.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope as set forth in the appended claims and their legal equivalents.

What is claimed is:

1. A method of fabricating an integrated circuit comprising the steps of:
    providing a semiconductor substrate having formed thereon a sacrificial silicon oxide layer, an interlayer dielectric layer formed over the sacrificial silicon oxide layer, and a dummy gate structure formed over the sacrificial silicon oxide layer and within the interlayer dielectric layer;
    removing the dummy gate structure to form an opening within the interlayer dielectric layer;
    removing the sacrificial silicon oxide layer within the opening to expose the semiconductor substrate within the opening;
    thermally forming an oxide layer on the exposed semiconductor substrate within the opening;
    subjecting the thermally formed oxide layer to a decoupled plasma oxidation treatment;
    etching the thermally formed oxide layer using a self-saturated wet etch chemistry; and
    depositing a high-k liner over the thermally formed oxide layer within the opening.

2. The method of claim 1, wherein providing a semiconductor substrate comprises providing a bulk silicon semiconductor substrate.

3. The method of claim 1, wherein providing a semiconductor substrate comprises providing a silicon-on-insulator semiconductor substrate.

4. The method of claim 1, wherein removing the dummy gate structure comprises etching the dummy gate structure using a hot phosphoric acid etch.

5. The method of claim 1, wherein removing the dummy gate structure comprises etching the dummy gate structure using a selective plasma dry etch.

6. The method of claim 1, wherein removing the sacrificial silicon oxide layer comprises etching the sacrificial silicon oxide layer using a solution of hydrofluoric (HF) acid with deionized water.

7. The method of claim 1, wherein thermally forming the oxide layer comprises thermally forming the oxide layer using low pressure in situ stream generation (LP-ISSG) oxidation.

8. The method of claim 1, wherein thermally forming the oxide layer comprises thermally forming the oxide layer to a thickness of about 4 Angstroms to about 10 Angstroms.

9. The method of claim 8, wherein thermally forming the oxide layer comprises thermally forming the oxide layer to a thickness of about 5 Angstroms.

10. The method of claim 1, wherein subjecting the thermally formed oxide layer to a decoupled plasma oxidation (DPO) treatment comprises generating a plasma using an RF power generator that generates plasma using a power between about 50 watts to about 2500 watts.

11. The method of claim 8, wherein subjecting the thermally formed oxide layer to the DPO treatment comprises increasing a thickness of the thermally formed oxide layer by at least about 1 Angstrom.

12. The method of claim 1, wherein etching the thermally formed oxide layer using the self-saturated wet etch chemistry comprises etching the thermally formed oxide layer using an SC1 etch chemistry.

13. The method of claim 1, wherein etching the thermally formed oxide layer comprises thinning the thermally formed oxide layer by about 1 Angstrom.

14. The method of claim 1, wherein depositing the high-k liner comprises depositing a hafnium oxide metal liner.

15. The method of claim 1, wherein depositing the high-k liner comprises depositing a zirconium oxide metal liner.

16. The method of claim 1, further comprising depositing a workfunction material layer over the high-k dielectric.

17. The method of claim 16, further comprising depositing a metal gate fill layer over the workfunction material layer.

18. A method of fabricating an integrated circuit comprising the steps of:
    providing a bulk-silicon semiconductor substrate having formed thereon a sacrificial silicon oxide layer, an interlayer dielectric layer formed over the sacrificial silicon oxide layer, and a dummy gate structure formed over the sacrificial silicon oxide layer and within the interlayer dielectric layer;
    etching the dummy gate structure to form an opening within the interlayer dielectric layer using a hot phosphoric acid etch or a selective plasma dry etch;
    etching the sacrificial silicon oxide layer within the opening to expose the semiconductor substrate within the opening using a solution of hydrofluoric (HF) acid with deionized water;

thermally forming an oxide layer on the exposed semiconductor substrate within the opening;

subjecting the thermally formed oxide layer to a decoupled plasma oxidation treatment;

etching the thermally formed oxide layer using a self-saturated wet etch chemistry; and depositing a high-k dielectric over the thermally formed oxide layer within the opening.

19. The method of claim 18, further comprising depositing a workfunction material layer over the high-k dielectric.

20. The method of claim 19, further comprising depositing a metal gate fill layer over the workfunction material layer.

21. The method of claim 20, wherein the metal gate fill layer comprises a tungsten material or an aluminum material.

22. A method of fabricating an integrated circuit comprising the steps of:

providing a bulk-silicon semiconductor substrate having formed thereon a sacrificial silicon oxide layer, an interlayer dielectric layer formed over the sacrificial silicon oxide layer, and a dummy gate structure formed over the sacrificial silicon oxide layer and within the interlayer dielectric layer;

removing the dummy gate structure to form an opening within the interlayer dielectric layer;

removing the sacrificial silicon oxide layer within the opening to expose the semiconductor substrate within the opening;

thermally forming an oxide layer on the exposed semiconductor substrate within the opening using low pressure in situ stream generation (LP-ISSG) oxidation;

subjecting the thermally formed oxide layer to a decoupled plasma oxidation treatment so as to increase a thickness of the thermally formed oxide layer by at least about 1 Angstrom;

treating the thermally formed oxide using an SC1 solution, de-ionized water with ozone, or dilute hydrogen fluoride; and depositing a high-k dielectric comprising hafnium oxide over the thermally formed oxide layer within the opening.

* * * * *